(12) United States Patent
Stemmer

(10) Patent No.: US 11,740,305 B2
(45) Date of Patent: Aug. 29, 2023

(54) MR IMAGING USING AN ACCELERATED MULTI-SLICE STEAM SEQUENCE

(71) Applicant: Siemens Healthcare GmbH, Erlangen (DE)

(72) Inventor: Alto Stemmer, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 17/576,026

(22) Filed: Jan. 14, 2022

(65) Prior Publication Data

US 2022/0229135 A1 Jul. 21, 2022

(30) Foreign Application Priority Data

Jan. 20, 2021 (DE) .................. 102021200476.8

(51) Int. Cl.
  *G01V 3/00* (2006.01)
  *G01R 33/483* (2006.01)
  *G01R 33/561* (2006.01)
  *G01R 33/565* (2006.01)
  *G01R 33/56* (2006.01)

(52) U.S. Cl.
  CPC ....... *G01R 33/4835* (2013.01); *G01R 33/561* (2013.01); *G01R 33/5602* (2013.01); *G01R 33/5659* (2013.01)

(58) Field of Classification Search
  CPC .............. G01R 33/3415; G01R 33/543; G01R 33/5659; G01R 33/36; A61B 5/055
  USPC ........................................................ 324/309
  See application file for complete search history.

(56) References Cited

U.S. PATENT DOCUMENTS

| 5,406,203 A | 4/1995 | Oh et al. |
| 2010/0191099 A1* | 7/2010 | Salerno ............... G01R 33/5601 600/420 |
| 2014/0266195 A1* | 9/2014 | Levin ............... G01R 33/56509 |

(Continued)

FOREIGN PATENT DOCUMENTS

WO  WO-2019076782 A1 * 4/2019 ........... G01R 33/288

OTHER PUBLICATIONS

Stemmer A., "Whole-Body STIR Diffusion-Weighted MRI in One Third of the Time"; Proc. Intl. Soc. Mag. Reson. Med. 21; pp. 2059; 2013.

(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

The present disclosure is directed to controlling a magnetic resonance imaging system for generating magnetic resonance image data from an object under examination, in which magnetic resonance raw data is captured, and at least one multi-slice STEAM pulse sequence is generated. The multi-slice STEAM pulse sequence comprises one excitation module for each slice, in each of which are generated a first slice-selective RF excitation pulse and a second slice-selective RF pulse, and one readout module for each slice for acquiring magnetic resonance raw data, which readout module comprises a third slice-selective RF pulse and further sequence elements for spatial encoding and for receiving RF signals. Between the excitation module and the readout module of a first slice is implemented at least one excitation module or one readout module for another slice.

18 Claims, 9 Drawing Sheets

(56) References Cited

U.S. PATENT DOCUMENTS

| | | | |
|---|---|---|---|
| 2016/0238685 A1* | 8/2016 | Neji | G01R 33/3852 |
| 2017/0234956 A1* | 8/2017 | Feiweier | G01R 33/56341 |
| | | | 324/309 |
| 2020/0241097 A1 | 7/2020 | Roebroeck et al. | |

OTHER PUBLICATIONS

Merboldt K.D., et.al., "Self-Diffusion NMR Imaging Using Stimulated Echoes", in: Journal of Magnetic Resonance, vol. 64, Oct. 1, 1985, pp. 479-486.

Merboldt K.D., et al."Diffusion Imaging Using Stimulated Echoes", in Magn.Reson.in Medicine 19, 233-239 (1991).

* cited by examiner

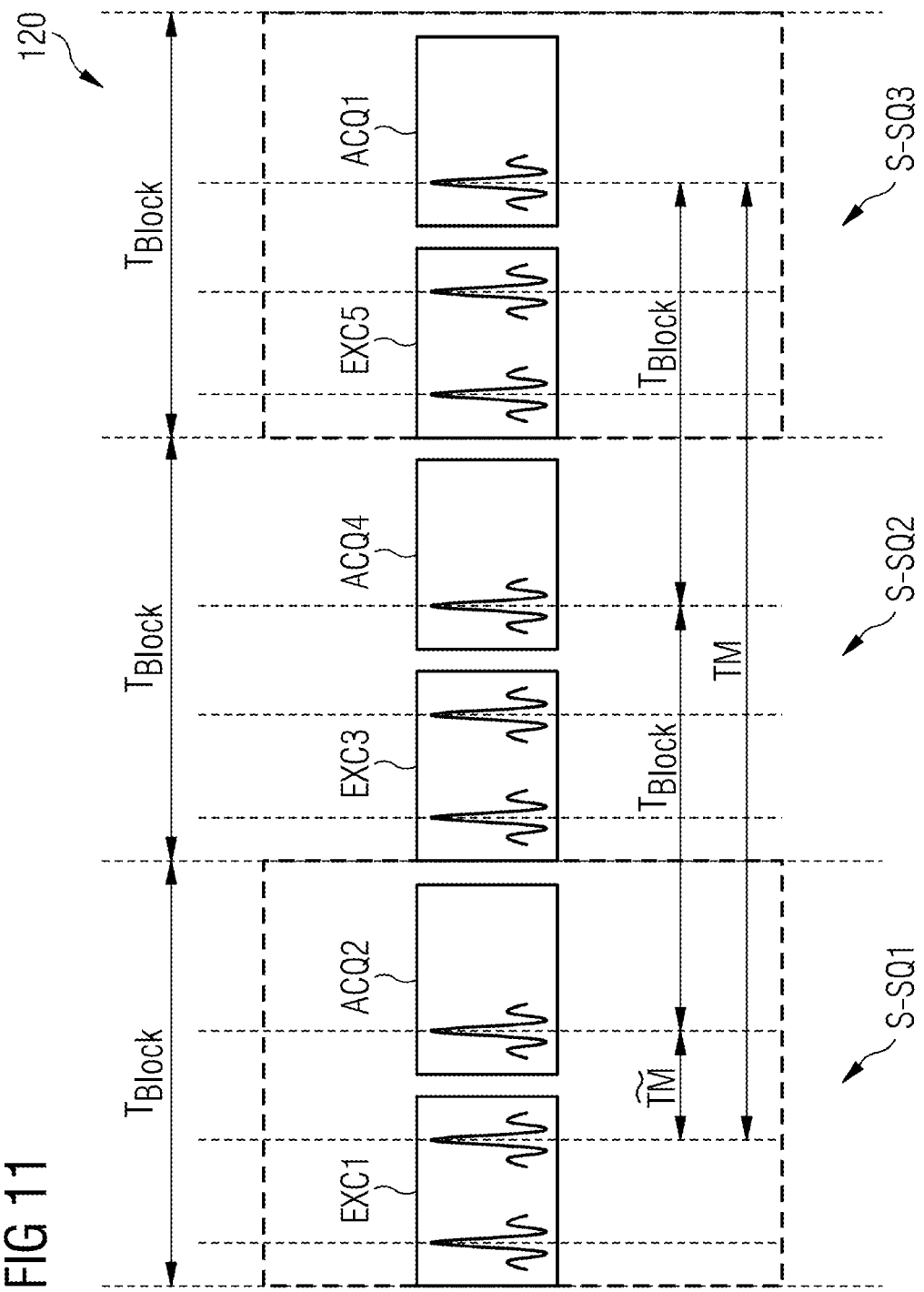

MR IMAGING USING AN ACCELERATED MULTI-SLICE STEAM SEQUENCE

CROSS-REFERENCE TO RELATED APPLICATIONS

The present application claims the benefit of the filing date of Germany patent application no. DE 10 2021 200 476.8, filed on Jan. 20, 2021, the contents of which are incorporated herein by reference in their entirety.

TECHNICAL FIELD

The disclosure relates to a method for controlling a magnetic resonance imaging system for producing magnetic resonance image data from an object under examination, in which magnetic resonance raw data is captured. In the method, at least one multi-slice STEAM pulse sequence is generated. In addition, the disclosure relates to a control sequence for controlling a magnetic resonance imaging system. The disclosure also relates to a control-sequence determination device. In addition, the disclosure relates to a magnetic resonance imaging system.

BACKGROUND

It is common to use modern imaging techniques to produce two-dimensional or three-dimensional image data that can be used for visualizing a patient to be imaged as well as for other applications. An imaging method that is especially health-friendly, in particular because it does not involve exposure to radiation, is magnetic resonance imaging.

SUMMARY

In a magnetic resonance facility, also called a magnetic resonance tomography system, a main magnetic field system is used to apply a relatively high main magnetic field, for example of 0.55, 1.5, 3, 5, or 7 Tesla, to the body to be examined. In addition, a gradient system is used to apply a magnetic field gradient. High-frequency excitation signals (RF signals) are then emitted via a radiofrequency transmit system by means of suitable antenna devices, causing the nuclear spins of certain atoms, which have been excited to resonance by this radiofrequency field, to be tipped through a defined flip angle with respect to the magnetic field lines of the main magnetic field. Radiofrequency signals, known as magnetic resonance signals, are emitted when the nuclear spins relax, and are received by suitable receive antennas and then processed further. Finally, the desired image data can be reconstructed from the raw data acquired in this manner.

Thus, a specific pulse sequence is implemented for a particular measurement, which sequence consists of a succession of radiofrequency pulses, also called RF pulses, in particular excitation pulses and refocusing pulses, and of gradient pulses, which are emitted in coordination therewith, in different spatial directions. Readout windows are set which are timed to fit this sequence and define the time frames in which the induced magnetic resonance signals are captured. In particular here, the timing within the pulse sequence, i.e. which pulses follow one another at what times apart, is crucial to the imaging. A multiplicity of control parameters is usually defined in what is known as a measurement protocol, which is created in advance and can be retrieved for a particular measurement, for instance from a memory, and, if applicable, can be modified by the operator locally, who can define additional control parameters, for instance a specific slice spacing in a stack of slices to be measured, a slice thickness, etc. A pulse sequence, also called a measurement sequence, is then calculated on the basis of all these control parameters.

In magnetic resonance imaging, an image is not acquired directly in the spatial domain, but instead first magnetic resonance signals are measured whose amplitude can be interpreted in k-space as the Fourier transform of the image acquisition. K-space is the spatial-frequency domain of the density distribution of the magnetic moments in a region under examination in which MR signals are acquired. If k-space is sampled sufficiently, then the spatial distribution of the density of magnetic moments is obtained by a Fourier transform (two-dimensional when sampling in slices). During the measurement, this k-space is filled with raw data that corresponds to the captured magnetic resonance signals after demodulation and digitization.

In order to excite the magnetic moments, there are a large number of different pulse sequence types, which have been developed for very different purposes.

One such pulse sequence is known as the STEAM sequence (STEAM=stimulated echo acquisition mode). FIG. 1 shows a conventional STEAM sequence 20.

In order to suppress a fat signal in magnetic resonance imaging, methods are often used that exploit the chemical shift of protons attached to fat molecules. Fat has several spectral components. One of these is olefinic fat. Olefinic fat has a resonant frequency which lies so close to the resonant frequency of free protons that it cannot be spectrally suppressed. If olefinic fat is not suppressed in diffusion-weighted imaging, this can cause errors in the diffusion parameters obtained, for instance in an ADC value. For a magnetic field of 3 T, olefinic fat has a T1 time of about 521 ms, which is relatively short compared with other tissue components. If the TM time, i.e. the time between a second RF pulse and a third RF pulse, in a diffusion-weighted STEAM sequence is chosen to be in the region of the T1 relaxation time or longer, then it is possible to significantly reduce the signal contributed by olefinic fat, and consequently the errors in the determined diffusion parameters.

Such a long TM time TM (known as the "mixing time" between the second and third RF pulses in a diffusion-weighted STEAM sequence) makes the diffusion-weighted STEAM sequence extremely inefficient. It is typical in a diffusion-weighted examination of the trunk to excite 30-50 slices per repetition interval TR. For a sufficient SNR (SNR=signal-to-noise ratio), the number of TR intervals TR is usually >25 even given the minimum number of two b-values and a number of signal averagings that is optimized for each b-value.

Thus, in the prior art a TM time TM of 500 ms lengthens the TR by 15-25 seconds compared with a spin-echo based diffusion-weighted sequence having the same echo time TE. For a measurement protocol having 25 TR intervals, the examination time is thus extended by about 6 to 10 minutes depending on the slice count N. This is clinically unacceptable.

The diffusion-weighted STEAM sequence was first described in the article "Self-diffusion NMR imaging using stimulated echoes" by Klaus-Dietmar Merboldt, Wolfgang Hänicke and Jens Frahm (Journal of Magnetic Resonance, Volume 64, Issue 3, 1 Oct. 1985, Pages 479-486).

All of the larger manufacturers offer spin-echo based diffusion sequences using single-shot EPI readout. STEAM-based diffusion sequences, however, are not commercially available, but are the subject of research. In particular, there are no STEAM sequences known in which the "mixing time" between the second and third RF pulses is used to acquire data from other slices.

The object is therefore to design STEAM-based diffusion sequences, in particular for diffusion imaging, to be more efficient and less time-consuming.

This object is achieved by the embodiments as discussed herein, including the claims, which are directed to controlling a magnetic resonance imaging system, a control sequence for controlling a magnetic resonance imaging system, a control-sequence determination device, and a magnetic resonance imaging system.

The multi-slice STEAM pulse sequence generated in the method according to the disclosure for controlling a magnetic resonance imaging system comprises one excitation module for each slice, in each of which are generated a first slice-selective RF excitation pulse and a second slice-selective RF excitation pulse, and one readout module, which comprises a third slice-selective RF pulse for receiving RF signals, for each slice for acquiring magnetic resonance raw data. Between the excitation module and the readout module for a first slice is implemented at least one excitation module or one readout module for another slice. In this context, a module is meant to comprise a plurality of sequentially and simultaneously output pulses, e.g. radiofrequency pulses, also known as RF pulses, and gradients, which are used for a sub-process in the overall imaging process. Such a sub-process may comprise, for example, excitation of magnetic resonance signals or readout of said magnetic resonance signals.

The method according to the disclosure makes it possible to reduce the TR time of a multi-slice STEAM sequence by a factor A compared with conventional techniques while achieving acceleration factors A greater than or equal to 6 for a TM time of 500 ms and typical resolution parameters.

The method according to the disclosure accelerates the application of diffusion-weighted single-shot EPI STEAM sequences having a typical slice count of <=20 by a factor of 9 for TM times of about 500 ms, and by a factor of 10 for TM times of 750 ms, without SNR losses arising. Diffusion-weighted STEAM imaging having long TM times hence becomes possible in clinically-acceptable times. This is because the acquisition time is largely independent of the TM time, because the potential acceleration A increases with increasing TM time, and therefore the time taken for the excitation and readout of a slice is largely independent of the chosen TM time. In contrast, conventionally the acquisition time increases linearly with the TM time because it is customary to make no further use of this time.

This is achieved by switching between the excitation module and the readout module for sampling a first slice, i.e. during the TM time of the first slice, at least one excitation module, or even a plurality of excitation modules, for one or more further slices. In more precise terms, except for the first TR interval and the last TR interval, are switched between the excitation module and the readout module for a particular slice, A−1 acquisition modules and A−1 readout modules, each for other slices. The excitation module for a slice here comprises the first slice-selective RF pulse and the second slice-selective RF pulse of the STEAM sequence, and the readout module comprises the third slice-selective RF pulse of the STEAM sequence.

As a result of the now viable use of a diffusion-weighted STEAM sequence, it is now possible in MR diffusion imaging to suppress fat, e.g. spectral fat components that cannot be suppressed using conventional spectral methods, such as olefinic fat. These conventional methods cannot be applied to olefinic fat because it differs from aliphatic fat components, which can be suppressed using a frequency-selective inversion pulse. Eliminating the olefinic fat by means of the method according to the disclosure makes it far easier to interpret diffusion-weighted images.

The control sequence according to the disclosure for controlling a magnetic resonance imaging system comprises one excitation module for each slice, with each excitation module comprising a first slice-selective RF excitation pulse and a second slice-selective RF pulse. The control sequence according to the disclosure also comprises one readout module for each slice for acquiring magnetic resonance raw data. Each readout module comprises a third slice-selective RF pulse and further sequence elements, for instance gradients and readout windows, for spatial encoding and for receiving RF signals. Between the excitation module and the readout module for a slice is positioned at least one excitation module or one readout module for another slice. The control sequence according to the disclosure shares the advantages of the method according to the disclosure.

The control-sequence determination device according to the disclosure is designed to determine the control sequence according to the disclosure, which can be implemented on a magnetic resonance imaging system. For this purpose, the control-sequence determination device according to the disclosure comprises an excitation-module generating unit for generating an excitation module for each slice of a slice stack in a region of interest, wherein the excitation module comprises for each slice a first slice-selective RF excitation pulse and a second slice-selective RF pulse. Also part of the control-sequence determination device according to the disclosure is a readout-module generating unit for generating a readout module for each slice for acquiring magnetic resonance raw data. Each readout module comprises a third slice-selective RF pulse and further sequence elements comprising gradients and readout windows for spatial encoding and for receiving RF signals. Also part of the control-sequence determination device is an arranging unit, which is configured to organize the timing of the excitation modules and readout modules of the respective slices, in other words to define an order for outputting said modules, such that between the excitation module and the readout module for one slice is implemented at least one excitation module or one readout module for another slice.

The magnetic resonance imaging system according to the disclosure comprises a control device, which is designed to control the magnetic resonance imaging system using a method according to the disclosure, and preferably comprises a control-sequence determination device according to the disclosure. The magnetic resonance imaging system according to the disclosure shares the advantages of the method according to the disclosure.

Some components of the magnetic resonance imaging system according to the disclosure and of the control-sequence determination device according to the disclosure can largely be embodied in the form of software components. This applies e.g. to parts of the excitation-module generating unit, of the readout-module generating unit, and of the arranging unit.

In principle, however, some of these components can also be implemented in the form of software-aided hardware, for instance FPGAs or the like, e.g. when especially fast calculations are needed. Likewise, the required interfaces can be designed as software interfaces, for instance if all that is involved is a transfer of data from other software components. They can also be designed, however, as hardwarebuilt interfaces driven by suitable software. Thus, the processing unit, the excitation-module generating unit, the readout-module generating unit, the arranging unit, etc. may alternatively be referred to herein as processing circuitry, excitation-module generating circuitry, readout-module generating circuitry, arranging circuitry, etc., although it will be understood that these components may be implemented as hardware, software, or combinations thereof.

An implementation largely in software has the advantage that even computer systems already present in a magnetic resonance imaging system can be easily upgraded, after a possible addition of extra hardware elements, by a software update to work in the manner according to the disclosure. In this respect, the object is also achieved by a corresponding computer program product comprising a computer program, which can be loaded directly into a memory device of said magnetic resonance imaging system, and which contains program segments to perform the software-implementable steps of the method according to the disclosure when the computer program is executed in the magnetic resonance imaging system.

Said computer program product may comprise in addition to the computer program, if applicable, extra elements such as e.g. documentation and/or extra components, including hardware components such as e.g. hardware keys (dongles etc.) for using the software.

For transfer to the memory device of a processing unit of a magnetic resonance imaging system and/or for storage on the processing unit, a computer-readable medium, for instance a memory stick, a hard disk, or any other portable or permanently installed data storage medium can be used, on which are stored the program segments of the computer program, which program segments can be downloaded and executed by a processing unit. For this purpose, the processing unit can comprise, for example, one or more interacting microprocessors or the like.

The dependent claims and the following description each contain particularly advantageous embodiments and developments of the disclosure. For instance, the claims in one category of claims can also be developed in a similar way to the dependent claims in another category of claims and the associated parts of the description. Furthermore, within the scope of the disclosure, the various features of different exemplary embodiments and claims can also be combined to create new exemplary embodiments.

In an embodiment of the method according to the disclosure, in a repetition interval of duration TR, sub-sequences of constant sub-sequence duration $T_{Block}$ are implemented in succession.

Sub-sequences may be implemented without gaps, so that the repetition time TR is an integer multiple of $T_{Block}$.

TR is here the time between two successive excitation modules for a first slice, and each sub-sequence comprises either one excitation module or one readout module, or an excitation module and a readout module that are each assigned to different slices. Tight interleaving of pulse sequences for different slices can advantageously be achieved by making use of the TM time that conventionally passes without being used, allowing a particularly large amount of time to be saved in MR imaging. This improves the comfort of the patients, and increases the efficiency or throughput per unit of time of an MR system, thereby allowing more efficient use of resources.

In the method according to the disclosure, between the sub-sequence comprising the excitation module for the first slice and the sub-sequence comprising the associated readout module for the first slice may be implemented A−2 further sub-sequences, where A is an integer much greater than one (e.g. 10, 100, 1000, 10,000, etc.). In this variant, in the best case, the TM time is filled to the maximum by sub-sequences to achieve a maximum time saving.

As already mentioned, in the method according to the disclosure, the time difference between the second RF pulse of the excitation module for a slice and the RF pulse of the associated readout module for the same slice may equal a time TM, also known as the "mixing time."

The readout module may be assigned to a sub-sequence of the same slice as the excitation module of the sub-sequence that was output (A−1) steps previously, where A is an integer much greater than one (e.g. 10, 100, 1000, 10,000, etc.). Advantageously, with a pulse sequence of this construction, particularly efficient use can be made of the time intervals available for the diffusion weighting.

In the method according to the disclosure, N excitation modules and N−A+1 readout modules are implemented in an initial TR-interval, and A−1 readout modules are implemented in a final interval, where in this case it holds that $$T_{Block} = \frac{TR}{N}.$$

N excitation modules and N readout modules are implemented in the remaining TR intervals. This variant achieves a maximum time saving or acceleration.

In this variant and the variant described below, in which the excitation modules and readout modules of all the N slices are implemented in each of the TR intervals, the time difference $\widetilde{TM}$ between the second RF pulse of an excitation module and the RF pulse of the associated readout module of a sub-sequence equals:

$$\widetilde{TM} = TM - (A-1) \times T_{Block}.$$

A−2 sub-sequences are implemented between the sub-sequence containing the excitation module for a first slice and the sub-sequence containing the readout module for the first slice. The duration of a sub-sequence is $T_{Block}$. This in turn means that the time difference between the RF pulse of a readout module of one sub-sequence and the RF pulse of the readout module of the subsequent sub-sequence is also equal to $T_{Block}$, because the timing of the excitation module and the readout module within a sub-sequence is the same for all the sub-sequences.

The time difference $\widetilde{TM}$ between the second RF pulse of the excitation module and the RF pulse of the readout module of a sub-sequence therefore differs from the physical mixing time TM by precisely A−1 time intervals $T_{Block}$.

In this variant, the number of successively implemented sub-sequences for acquiring N different slices M times equals the value M×N+A−1, where M defines the number of readout modules per slice.

In a further embodiment of the method according to the disclosure, the excitation modules and readout modules for all N slices are implemented in each of the TR intervals, and it holds that $$T_{Block} = \frac{TR}{N+A-1}.$$

When the method is used to acquire N different slices M times, in this variant the number of successively implemented sub-sequences has the value M×(N+A−1), where M defines the number of readout modules per slice.

In the method according to the disclosure, the N slices are excited repeatedly in succession, and the first excitation module for at least a second slice is implemented earlier than the second excitation module for a first slice, and the first readout module for the second slice is implemented later than the second excitation module for the first slice. The TM time is advantageously filled to the maximum by sub-sequences to achieve a maximum time saving.

In the method according to the disclosure, the excitation module and the readout module for at least one sub-sequence may comprise diffusion gradients, which differ in terms of direction or amplitude.

The method according to the disclosure may output a diffusion-weighted single-shot EPI sequence.

The method according to the disclosure and the control sequence according to the disclosure make it possible to accelerate a diffusion-weighted single-shot EPI STEAM sequence having a typical slice count of >=20 by a factor of 8 for TM times of about 500 ms, and by a factor of 10 for TM times of about 750 ms, without having to allow for any disadvantages of practical relevance, for instance SNR losses.

Thus, the method according to the disclosure and the control sequence according to the disclosure make diffusion-weighted STEAM imaging having long TM times possible in clinically-acceptable times. In more specific terms, the acquisition time is largely independent of the TM time, because the potential acceleration increases with increasing TM time, and therefore the time taken for the excitation and readout of a slice is largely independent of the chosen TM time. Conventionally, on the other hand, this time increases linearly with the "mixing time" TM between the second RF pulse and the third RF pulse because the TM is largely unused.

Therefore, a diffusion-weighted STEAM sequence can be used to suppress MR signals from fat that cannot be suppressed using spectral methods, e.g. spectral fat components attributable to olefinic fat.

A STEAM sequence having long TM times allows a high diffusion weighting using a weak gradient system, and should therefore be ideal for an MR system in the entry sector for achieving a sufficiently high diffusion weighting. Since a STEAM sequence having long TM times allows a high diffusion weighting using comparatively small gradients, this should also significantly reduce problems arising from eddy currents.

In the method according to the disclosure, the slice-selective RF pulses each influence a plurality of different slices simultaneously.

The simultaneous excitation of a plurality of slices, also referred to by the acronym SMS for "simultaneous multi-slice," is a technique in which multiband pulses, as they are known, are used to excite a plurality of slices simultaneously. Using a plurality of receive coils and parallel image reconstruction methods, it is possible to compute separate images from the simultaneously excited slices. The multiband factor MB defines the number of simultaneously excited slices. The method according to the disclosure can be combined with SMS. This is done by replacing the three 90° pulses with multiband RF pulses, which excite the MB slices simultaneously. The number N of slices in the equations above then is replaced by N/MB.

Each RF pulse now influences MB slices simultaneously. If MB is a factor of 3, for example, the method according to the disclosure can be applied as described above on the assumption that there would be only ⅓ of the slices. The total number of physical slices N must therefore be replaced by the number of slices that are excited separately from each other. In other words, the methods are independent of each other but can also be combined.

The total acceleration achieved for the combined method is the product of the acceleration factor A and the acceleration MB achieved by the SMS technique. Known technical problems with multiband RF pulses used in the SMS technique are their high peak RF amplitude, which can exceed the capabilities of the RF amplifier(s), and the high specific absorption rate (SAR) of the multiband RF pulses. The STEAM technique uses only 90° pulses. 90° pulses generally have a lower peak RF amplitude and expose the patient to a lower SAR (specific absorption rate) than the 180° pulses used in the spin-echo based methods. Therefore, applying the method according to the disclosure to SMS pulse sequences is particularly promising.

The slices of a region of interest that are to be measured or imaged are often divided into a plurality of packets, which are measured in succession. In the case of two packets, initially, for instance, all the data required for reconstructing the image from the even slices is acquired in full before acquisition of the odd slices begins. The numbering of a slice corresponds to its anatomical position in this case. The slice number is therefore incremented or decremented by a value of 1 from one slice to the slice that is its spatially-immediate neighbor. Thus, dividing into two packets doubles the effective slice spacing. The same applies when dividing into three or more packets. This reduces cross-talk between the slices. Cross-talk refers to the fact that each selective RF pulse never has a perfect slice profile and therefore unavoidably also influences its neighbors. This can have a negative impact on the signal or the contrast of the neighboring slice if the time interval between measuring the neighboring slices is not equal to several T1 times of the tissue.

In addition, dividing into a plurality of packets is used, for instance, to reduce the duration of the acquisition phase in a physiologically triggered measurement.

The method according to the disclosure is compatible with dividing the slices into a plurality of packets. The number N in the description above then refers to the number of slices per packet, and not to the total number of slices. In general, the number of slices per packet may also be different for different packets.

In the case of a variant that is not diffusion-weighted, the diffusion gradients are replaced by at least one pair of crusher gradients whose moment is sufficient to generate phase dispersion of at least $4\pi$ along an edge of an image voxel. This is necessary to de-phase ("spoil") the FID (free induction decay) of the third RF pulse. It is generally the case that along the slice-selection direction, the dimension of the voxel is the largest, and therefore the gradient moment needed to produce the phase dispersion is the smallest.

In the case of a variant in which a "single-shot" is not performed, a plurality of excitation modules and readout modules are switched for each image. This is already included, for example, in the embodiments shown in FIG. 4 and FIG. 5. M was defined above as the number of excitations of a slice that are required to acquire all the data needed to compute the image. If, for example, k images are meant to be computed, and r denotes the number of excitations required per image, then: M=k×r+s. Here, s denotes the additional excitations that are switched to approach dynamic equilibrium or to acquire coil calibration data etc. One example would be a segmented EPI sequence such as "Resolve."

In the case of a variant for which an EPI sequence is not used, at least the EPI readout module are replaced. It may also be necessary, however, to replace the entire readout module.

BRIEF DESCRIPTION OF THE DRAWINGS/FIGURES

The disclosure is described again below in greater detail using exemplary embodiments and with reference to the accompanying Figures, in which:

FIG. 11 is a schematic diagram of sub-sequences having alternating excitation modules and readout modules for different slices.

DETAILED DESCRIPTION

Figure 1:
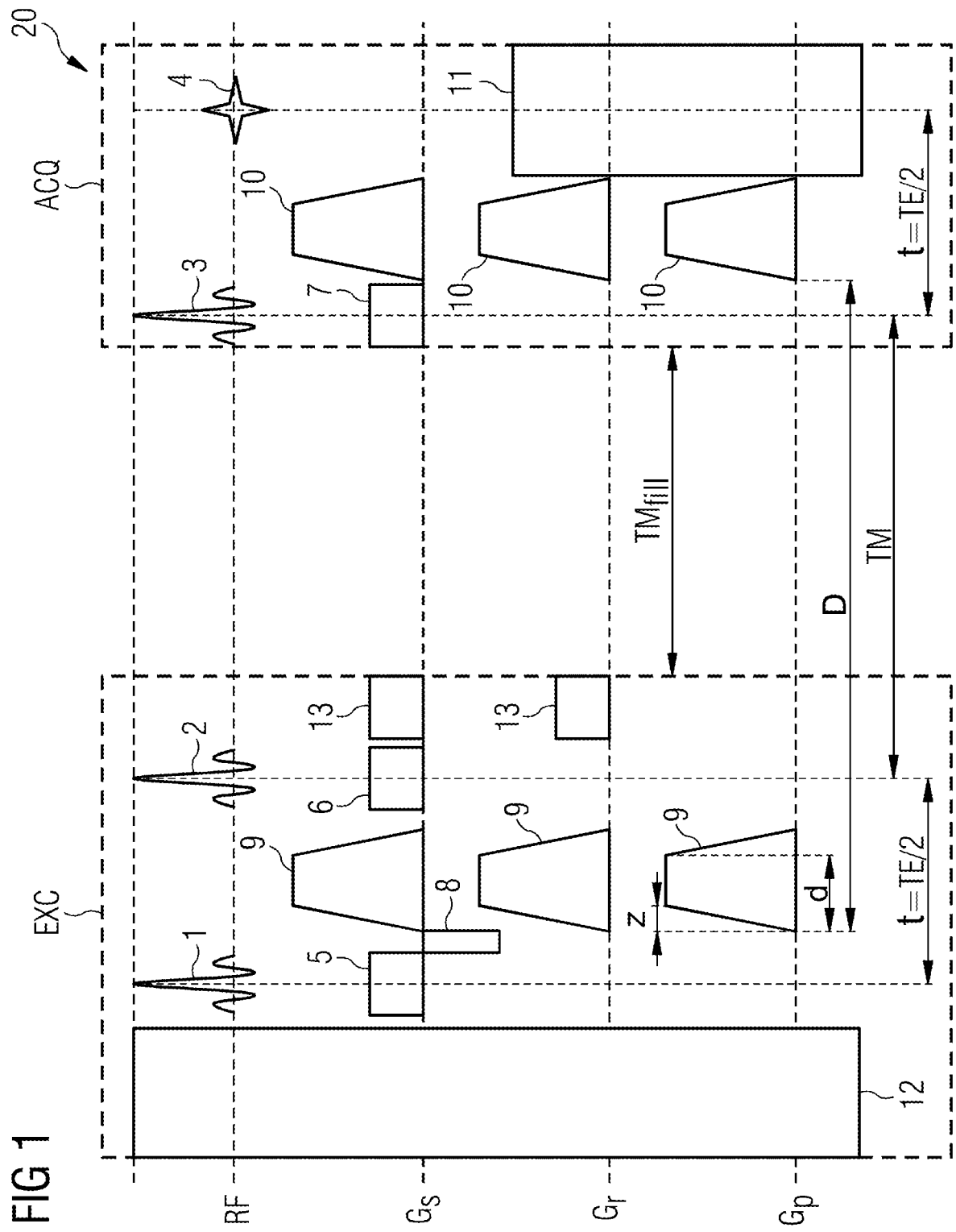
FIG. 1 is a schematic diagram of a conventional STEAM sequence for single-slice excitation.

FIG. 1 shows schematically a conventional STEAM sequence 20 having single-slice readout. The STEAM sequence 20 consists of three 90° RF pulses 1, 2, 3 and two crusher gradients 9, 10 having the same gradient moment, of which the first crusher gradient 9 is switched between the first RF pulse 1 and the second RF pulse 2, and the second crusher gradient 10 is switched after the third RF pulse 3. The stimulated echo 4 is formed a time interval T after the third RF pulse 3. There is the time that elapses between the first RF pulse 1 and second RF pulse 2. The stimulated echo 4 is generated via the following signal path:

A first RF excitation pulse 1 in FIG. 1 produces a transverse magnetization. In the time interval T between the first RF pulse 1 and the second RF pulse 2, the spins in the excited region of interest acquire a position-dependent phase PH as a consequence of position-dependent imperfections in the Bo field and in the first crusher gradients 9. The second RF pulse 2 negates the spatially dependent phase PH and flips the magnetization of the spins back into the longitudinal axis. In the time interval of duration TM between the second RF pulse 2 and the third RF pulse 3, gradients and Bo imperfections have no effect on the phase PH of the longitudinal magnetization. The phase dispersion PH-D acquired between the first RF pulse 1 and the second RF pulse 2 is so-to-speak "remembered" in the longitudinal axis. This longitudinal magnetization is excited again by the third RF pulse 3, and re-phased by the second crusher gradient 10 and as a consequence of the position-dependent B0 imperfections, with the result that what is known as a stimulated echo 4 is formed at the time T after the third RF pulse 3. The longitudinal magnetization that is excited by the third RF pulse 3 for the first time, i.e. was not located in the transverse plane in the time interval between the first and second RF pulses, is de-phased by the second crusher gradient 10 and therefore contributes no signal to the acquired signal 4. In addition, spoiler gradients 13 for de-phasing additional signal paths can be switched between the second RF pulse 2 and the third RF pulse 3.

During the time interval TM, the magnetization is subject only to the longitudinal relaxation process associated with the T1 relaxation, and not to the faster transverse relaxation process, also known as T2 relaxation. This makes the STEAM sequence interesting in particular for diffusion-weighted imaging, in which the two crusher gradients are replaced by diffusion gradients. By extending the mixing time TM, it is possible to increase a maximum diffusion weighting of the STEAM sequence without extending the echo time TE. In contrast, for a diffusion sequence based on the spin-echo technique, increasing the maximum diffusion weighting is always associated with an increase in the echo time. Therefore, STEAM is particularly interesting for diffusion imaging.

Since the magnetization is de-phased during the time interval TM, this time interval makes a diffusion contribution without extending the echo time TE relevant to the T2 relaxation. This situation differentiates the diffusion-weighted STEAM sequence from the classical spin-echo based diffusion sequences such as the Stejskal-Tanner sequence, in which an increase in the maximum diffusion weighting, the b-value, or in the diffusion time A, the time between the diffusion gradients, is always associated with a longer echo time TE and thus leads to an increase in the T2-induced signal loss.

The magnetization is subject to T2 relaxation only in the time intervals between the first and second RF pulses, and between the third RF pulse and the stimulated echo. The echo time TE of the STEAM sequence is accordingly TE=2×T.

Another advantage, in particular at higher field strengths, of a diffusion-weighted STEAM sequence over a spin-echo based diffusion sequence is that it manages without SAR-intensive refocusing pulses.

All the RF pulses 1, 2, 3 are slice-selective. This is achieved by switching a slice-selection gradient 5, 6, 7 during the application of the RF pulses 1, 2, 3 respectively, and by a suitable choice of the RF center frequency of the RF pulses 1, 2, 3. If the second RF pulse 2 and the third RF pulse 3 have the same bandwidth and duration, one slice-re-phasing gradient 8 after the first RF pulse 1 suffices.

A fast EPI readout module 11, for instance, can be used for the spatial encoding and readout of the stimulated echo 4 in the STEAM sequence. An EPI readout module comprises gradients for frequency-encoding and phase-encoding of the read-out signal. Details are known to a person skilled in the art and therefore not described further here. Using a fast technique such as EPI to read out an entire image has the advantage of relative insensitivity to movement. EPI does require complete fat suppression, however, to avoid ghosting artifacts in the phase-encoding direction.

The dominant spectral component of fatty tissue ($CH_2$ group in the aliphatic chain) has a chemical shift of approximately 3.4 ppm compared with water, and therefore can be suppressed by spectrally selective pre-pulses 12 or a gradient-reversal technique (not shown). The gradient-reversal technique exploits the fact that, as a result of the chemical shift, the fat slice affected by a slice-selective RF pulse is shifted with respect to the water slice in the direction of the gradient. By suitable selection of the bandwidths of the RF pulse and the signs of the slice-selection gradients, it is possible to make this shift so large that fat spins of the dominant spectral component contribute no signal to the stimulated echo.

A diffusion sensitivity of the read-out signal can be achieved by suitable selection of the crusher gradients 9, 10. The crusher gradients 9, 10 are then also referred to as diffusion gradients.

The scheme shown produces a diffusion sensitivity (b-value contribution) of $$b = 4\pi^2 \gamma^2 G^2 \left[ \delta^2(\Delta - \delta/3) + \frac{\zeta^3}{30} - \frac{\delta\zeta^2}{6} \right]$$

along a gradient direction.

Here, G denotes the amplitude of a trapezoidal gradient, $\zeta$ a ramp time of a gradient, $\delta$ the duration of a gradient (ceiling time and ramp time), and $\Delta$ is the time difference between the two gradients.

Lengthening the time interval TM between the second RF pulse and the third RF pulse therefore also lengthens the time difference $\Delta$ between the two crusher gradients 9, 10 and hence the diffusion sensitivity of the sequence. Only the time intervals in which the spins that contribute to the stimulated echo signal are lying in the transverse plane make a contribution to the T2 weighting, however. These are the two time intervals of length T between the first RF pulse 1 and the second RF pulse 2, and between the third RF pulse 3 and the stimulated echo 4. The echo time TE of the sequence 20 is hence TE=2×T.

During the time interval TM, also called the mixing time, the magnetization is subject only to the slower longitudinal relaxation process (T1 relaxation).

The spoiler gradients 13 switched between the second RF pulse 2 and the third RF pulse are used for dephasing additional signal paths.

The STEAM sequence 20 shown in FIG. 1 allows a single excitation of one slice and readout of an image. A clinical dataset comprises about 30 to 50 slices. In addition, each slice is usually excited and read out repeatedly. This is necessary, for instance, to capture images with a different diffusion weighting (for instance to calculate an ADC value) and/or a different diffusion direction (for instance in order to compute an isotropic or trace-weighted diffusion image), and/or to increase the signal-to-noise ratio of the computed images by means of averaging.

Furthermore, data that is needed for instance for coil calibration in parallel imaging or for correcting image distortion is read out after a separate excitation. At the start of a measurement, the slices are also excited without any associated data-readout in order for the magnetization to approach dynamic equilibrium.

TR denotes below the time that elapses between the successive excitation of a particular slice. N denotes the number of slices that are excited during a TR interval. M denotes the number of excitations of a slice that are required to acquire all the data needed for image computation or image reconstruction. Thus the sequence 20 shown in FIG. 1 is implemented N×M times.

For describing the method according to the disclosure, it is helpful to divide the STEAM sequence of FIG. 1 into an excitation module EXC and a readout module ACQ. The excitation module EXC comprises e.g. the first RF pulse 1 and the second RF pulse 2, and the diffusion or crusher gradients 9 between the first RF pulse 1 and the second RF pulse 2. The excitation module EXC also comprises further RF pulses and gradients 12, which are applied or switched before the excitation pulse 1, for instance for fat suppression or for regional saturation of the magnetization.

The readout module ACQ comprises e.g. the third RF pulse 3 of the STEAM sequence 20, and the diffusion or crusher gradients 10, which are switched between the third RF pulse 3 and the "actual" readout module 11, for example an EPI readout module.

Figure 2:
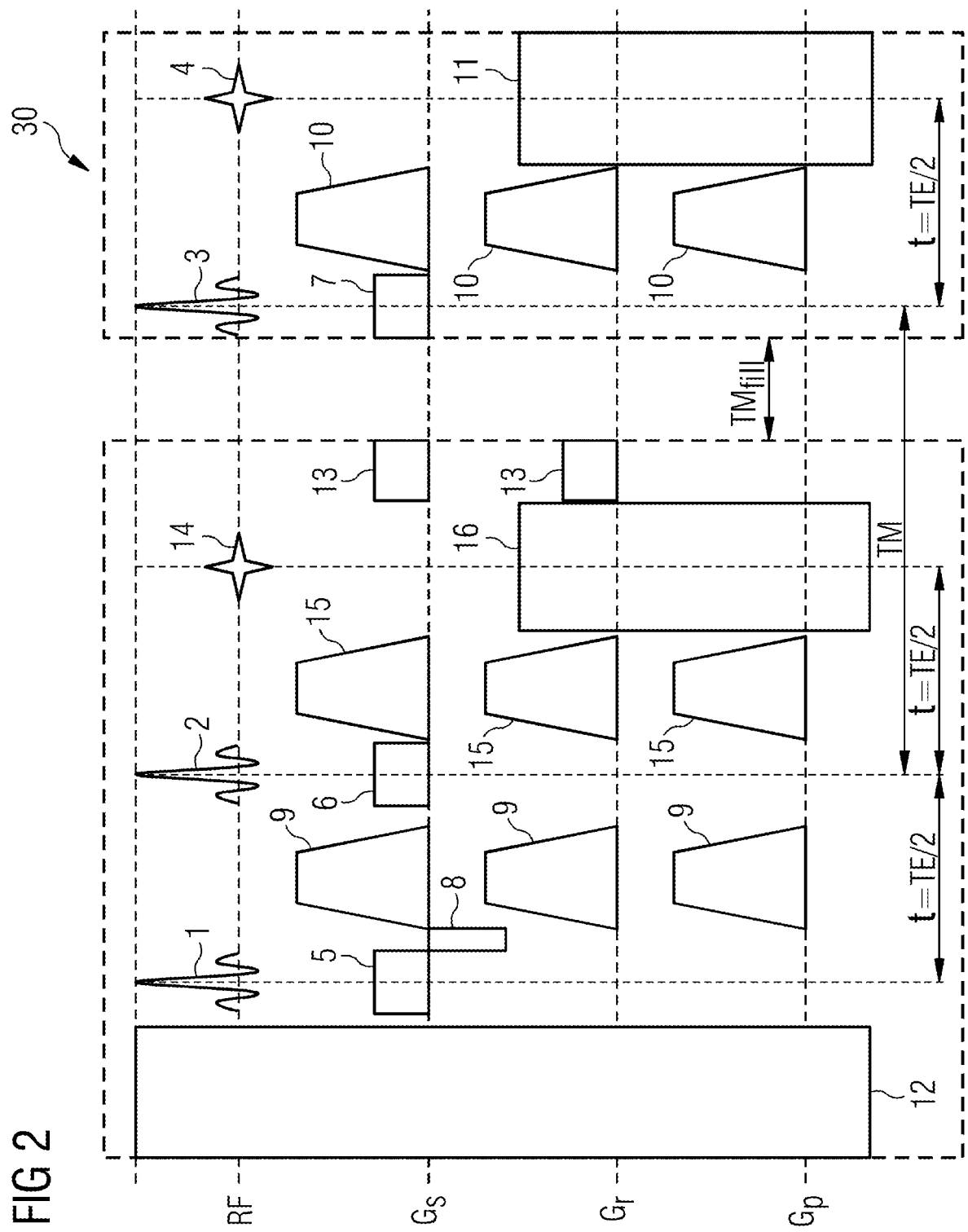
FIG. 2 is a schematic diagram of a conventional STEAM sequence having spin-echo acquisition.

FIG. 2 describes a STEAM sequence 30 having spin-echo acquisition. The STEAM sequence shown in FIG. 2 has three RF pulses 1, 2, 3, which generate up to five echoes. In addition, unlike in FIG. 1, in the STEAM sequence shown in FIG. 2, additional gradients 15 are switched in a time interval after the second RF pulse. The transverse magnetization generated by the first RF pulse 1 is partially refocused by the second RF pulse 2, with the result that a spin echo 4 is formed at the time T after the second RF pulse, for example the first spin echo 14 in FIG. 2, provided the gradients 15, which are switched in the time interval T after the second RF pulse, each have the same moment as the gradients 9, which are switched between the first RF pulse 1 and the second RF pulse 2. This echo 14 can be read out using a second EPI module 16, for instance. Stimulated echo 4 and spin echo 14 have the same T2 weighting but different T1 weighting and diffusion weighting.

The method according to the disclosure is compatible with reading out the spin-echo. When applying the method according to the disclosure to a spin echo sequence, the gradients 15 and the additional EPI module 16 become part of the excitation module.

Figure 3:
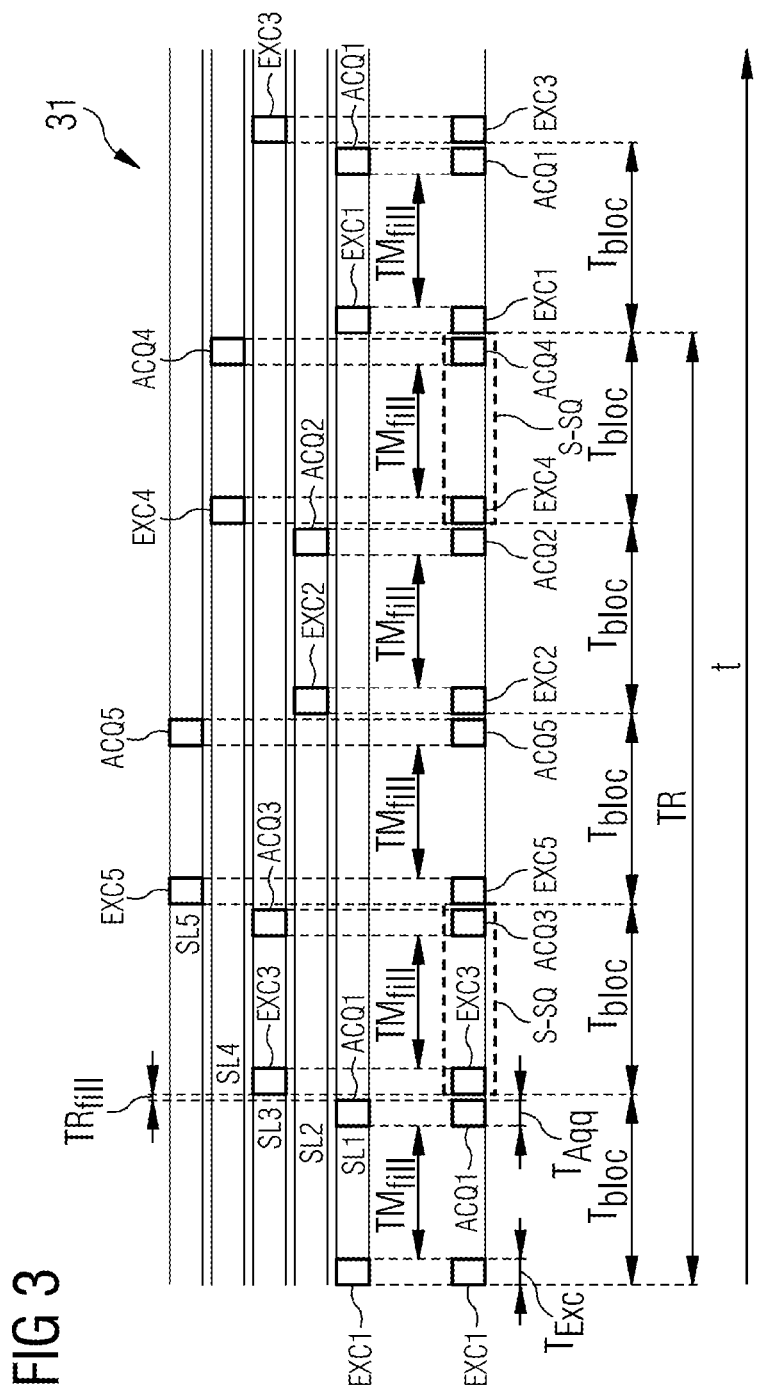
FIG. 3 shows a conventional multi-slice STEAM sequence having sequential output of sub-sequences.

FIG. 3 shows the structure of the entirety of a conventional multi-slice STEAM sequence 31. In the example, the number of slices is N=5.

A sub-sequence S-SQ comprises an excitation module $EXC_n$, a first fill time $TM_{fill}$ or a wait interval of the stated wait time, a readout module $ACQ_n$ and optionally an additional fill time $TR_{fill}$ or fill interval of the stated fill time. The excitation module $EX_n$ and the readout module $ACQ_n$ of a sub-sequence n belong to the same slice. The fill time $TM_{fill}$ between the excitation module $EXC_n$ and the readout module $ACQn$ is chosen such that the time between the second RF pulse 2 and the third RF pulse 3 equals the desired TM time TM. Sub-sequences for different slices $SL_n$ are implemented sequentially. The excitation modules $EXC_n$ and readout modules $ACQ_n$ for all the slices $SL_1, \ldots SL_5$ are shown in the bottom row of FIG. 3. Significant "idle times" spent waiting for the TM time to elapse or pass are the result.

$T_{Exc}$ denotes the duration of the excitation module EXC, $T_{Acq}$ denotes the duration of a readout module ACQ, $T_{Block}$ denotes the duration of a sub-sequence, and TA denotes the duration of an entire sequence. These notations are used to give the following equations:

$$T_{Block} = T_{Exc} + TM_{fill} + T_{Acq} + TR_{fill}, \quad (1)$$

$$TR = N \times T_{Block}, \quad (2)$$

$$TA = M \times TR, \quad (3)$$

$$\overset{2+3}{\Longrightarrow} TA = M \times N \times T_{Block}. \quad (4)$$

Figure 4:
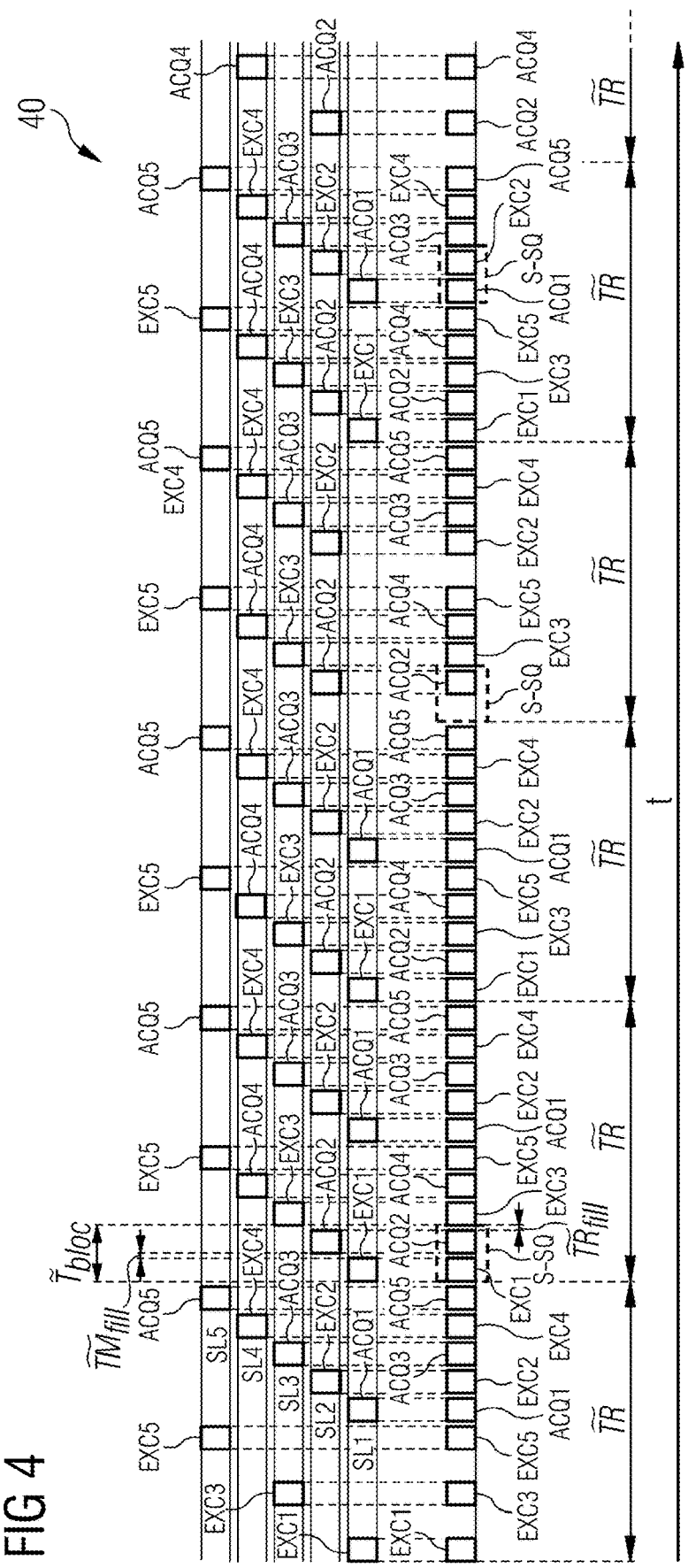
FIG. 4 shows a multi-slice STEAM sequence according to an exemplary embodiment of the disclosure.

FIG. 4 shows schematically the structure of a STEAM sequence 40 according to an exemplary embodiment of the disclosure. The multi-slice sampling is restricted to N=5 slices solely for the sake of a simpler diagram. The time interval between the excitation module $EXC_n$ and the readout module $ACQ_n$ of a particular slice n is used to switch excitation modules $EXC_k$ or readout modules $ACQ_k$ of other slices. Once again, it is possible to divide the sequence 40 into sub-sequences S-SQ, each of which comprises an excitation module $EXC_n$, a first fill time $\widetilde{TM}_{fill}$, a readout module $ACQ_k$ and a second fill time $\widetilde{TR}_{fill}$, where k does not equal n and defines a position or number k, n of a slice $SL_k$, $SL_n$ to be sampled. Therefore, the excitation module $EXC_n$ and the readout module $ACQ_k$ of a sub-sequence S-SQ belong to different slices $SL_n$, $SL_k$, and the first fill time $\widetilde{TM}_{fill}$ is significantly shorter than the first fill time $TM_{fill}$ of the sequence shown in FIG. 3 for the same mixing time TM.

In FIG. 4, with the exception of the first and last TR intervals, between the excitation module $EXC_n$ and the readout module $ACQ_n$ of a particular slice $SL_n$, i.e. of one and the same slice $SL_n$, are output two excitation modules $EXC_k$, $EXC_l$ and are switched two readout modules $ACQ_m$, $ACQ_j$ for other slices. This is equivalent to two sub-sequences S-SQ. Thus, in the time interval $T_{Bloc}$, in which in the conventional single sub-sequence S-SQ is implemented, are implemented sequence modules EXC, ACQ equivalent to the 3 sub-sequences S-SQ. Since the total number of sub-sequences S-SQ used to acquire the data needed for image reconstruction does not change, an acceleration by a factor of approximately A=3 is achieved.

The actual acceleration of the acquisition is slightly less because in the two first sub-sequences S-SQ of the first TR interval TR, generally in the A−1 first sub-sequences S-SQ of the first TR interval TR, only excitation modules EXC are output, as can be seen in FIG. 4, and accordingly two further sub-sequences, in which just readout modules ACQ are switched are added to the end of the sequence 40.

The series of the slice indices of the readout modules follows the series of the slice indices of the excitation modules having the slice indices 1, 3, 5, 2, 4, 1, 3, 5, 2, 4, . . . but set back by A−1, so in the example where A=3, by 2 elements. This means that the excitation module EXC2 of the slice SL2 is followed by the readout module ACQ3 of the slice SL3; the excitation module EXC4 of slice SL4 is followed by the readout module ACQ5 of slice SL5, etc.

Complex relationships result between the variables N, TR, TM, etc. The maximum acceleration A is largely dependent on TM, the duration $T_{EXC}$ of an excitation module EXC, and the duration $T_{ACQ}$ of a readout module ACQ. Roughly speaking, this determines how many excitation modules and readout modules can be packed into the fill time $TM_{fill}$.

For example, an operator specifies a required number N of slices, the b-value, the mixing time TM, and resolution parameters for diffusion imaging. These values then result in the minimum duration of an excitation module and of a readout module and the minimum echo time. Then, all possible acceleration factors A that can be achieved by adjusting the repetition time TR are calculated and offered to the user. If the user selects an acceleration factor A, the repetition time TR is adjusted accordingly. Normally, the user will select the maximum possible acceleration factor A. The value of the maximum acceleration factor A generally increases with the mixing time TM. For a fixed mixing time TM, the value of the repetition time TR decreases with the selected acceleration factor A. This is unusual in the sense that the repetition time TR is normally specified by the user.

In general, the following holds:

If $\widetilde{T}_{Block}$ defines the duration of a sub-sequence S-SQ of the sequence 40 according to the disclosure, and if A−1 sub-sequences S-SQ of duration $\widetilde{T}_{Block}$ fit into the fill time $TM_{fill}$ of the conventional sequence, then:

$$\widetilde{T}_{Block} = T_{Exc} + \widetilde{TM}_{fill} + T_{Acq} + \widetilde{TR}_{fill} \quad (5),$$

$$\widetilde{TM}_{fill} = TM_{fill} - (A-1) \times \widetilde{T}_{Block} \quad (6),$$

$$\widetilde{TR} = N \times \widetilde{T}_{Block} \quad (7),$$

$$\widetilde{TA} = M \times \widetilde{TR} + (A-1) \times \widetilde{T}_{Block} \quad (8),$$

Substituting equation 6 in equation 5 yields:

$$\widetilde{T}_{Block} = T_{Exc} + TM_{fill} - (A-1) \times \widetilde{T}_{Block} + T_{Acq} + \widetilde{TR}_{fill}$$

Solving for $\widetilde{T}_{Block}$:

$$A \times \widetilde{T}_{Block} = T_{Exc} + TM_{fill} + T_{Acq} + \widetilde{TR}_{fill}$$

Using equation 1 gives:

$$A \times \widetilde{T}_{Block} = T_{Block} - TR_{fill} + \widetilde{TR}_{fill} \quad (9)$$

In addition, the acquisition time of the sequence according to the disclosure is obtained from equations 7 and 8:

$$\widetilde{TA} = M \times N \times \widetilde{T}_{Block} + (A-1) \times \widetilde{T}_{Block}$$

The minimum acquisition time is obtained when $TR_{fill} = \widetilde{TR}_{fill} = 0$ to give:

$$\widetilde{TA}_{min} = M \times N \times \frac{T_{Block}}{A} + (A-1) \times \widetilde{T}_{Block} \quad (10)$$

$$\overset{2+3}{\Longrightarrow} \widetilde{TA}_{min} = \frac{TA_{min}}{A} + (A-1) \times \widetilde{T}_{Block}$$

Equation 10 reflects the result already obtained from the illustration: apart from the A−1 sub-sequences S-SQ added to the end of a sequence, the minimum acquisition time $\widetilde{TA}_{min}$ of the sequence 40 according to the disclosure is shortened by a factor A compared with the minimum acquisition time $TA_{min}$ of the sequence 30 from the prior art. For typical parameters, the second term $(A-1) \times \widetilde{T}_{Block}$ in equation 10 is negligibly short compared with the first term $$\frac{TA_{min}}{A}.$$

Thus, the number A plays the role of an acceleration factor. The minimum repetition time $\widetilde{TR}_{min}$ of the sequence according to the disclosure is correspondingly shorter by a factor A than the minimum repetition time TR from the prior art.

Taking equations 7, 9 and 2 gives initially:

$$\widetilde{TR} = N \times \tilde{T}_{Block} \overset{9}{\Longrightarrow} \widetilde{TR} = \times \frac{T_{Block} - TR_{fill} + \widetilde{TR}_{fill}}{A} \overset{2}{\Longrightarrow} \frac{TR}{A} + \frac{\widetilde{TR}_{fill} - TR_{fill}}{A}$$

This yields, on setting $TR_{fill} = \widetilde{TR}_{fill} = 0$, the minimum repetition time:

$$\widetilde{TR}_{min} = \frac{TR_{min}}{A}. \quad (11)$$

Figure 5:
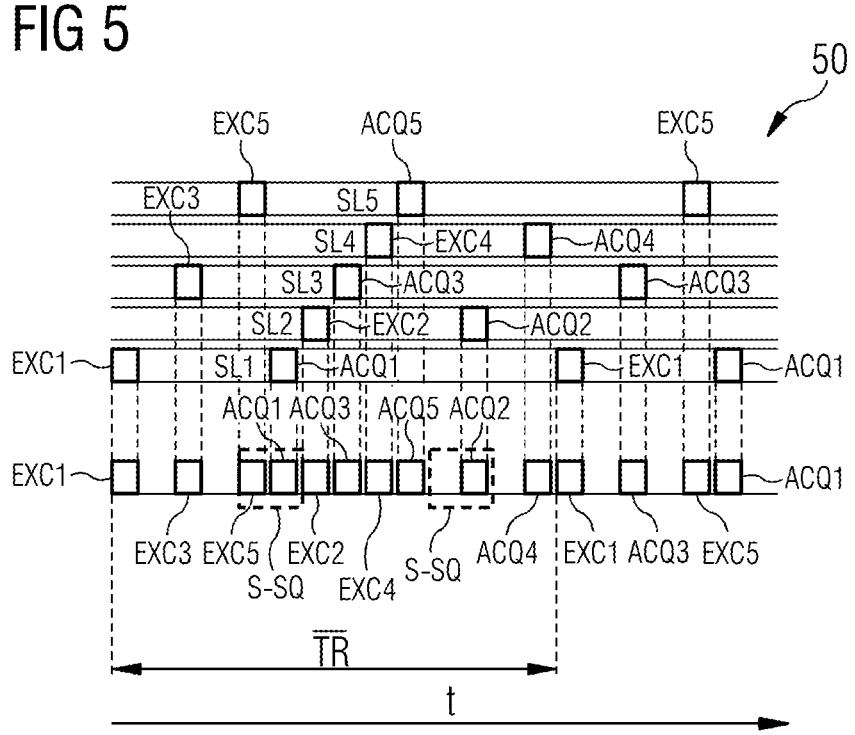
FIG. 5 shows a multi-slice STEAM sequence according to an alternative exemplary embodiment of the disclosure.

FIG. 5 shows a schematic pulse sequence diagram containing a pulse sequence 50, which illustrates a second embodiment of the method according to the disclosure. Unlike the pulse sequence 40 shown in FIG. 4, for the pulse sequence shown in FIG. 5 the excitation and readout modules of all N slices are implemented in every TR interval TR. In the first A−1 sub-sequences S-SQ, in each TR interval TR is implemented only the excitation module EXC, and the readout module ACQ is replaced by a fill time (idle time) of duration $T_{Acq}$. Correspondingly, in the last A−1 sub-sequences S-SQ in each TR interval TR, the excitation module EXC is replaced by a fill time of duration $TE_{Exc}$. In this case, A−2 is again the number of sub-sequences S-SQ that are switched between the sub-sequence S-SQ containing the excitation module $EXC_n$ of a particular slice $SL_n$ and the sub-sequence S-SQ containing the readout module $ACQ_n$ of this slice $SL_n$. The scheme shown in FIG. 5 is repeated in every TR interval. Equations 5 and 6 still hold. The repetition time $\overline{TR}$ and the acquisition time $\overline{TA}$ in this embodiment, however, are given by:

$$\overline{TR} = (N+(A-1)) \times \tilde{T}_{Block} \quad (12)$$

$$\overline{TA} = M \times \overline{TR} \quad (13).$$

Thus, for a large number M of TR intervals, the embodiment shown in FIG. 5 is significantly less efficient than the embodiment of FIG. 4 in terms of time required. This embodiment can have advantages nonetheless. For example, it is possible to wait for a physiological trigger before each TR interval. Physiological triggering refers here to a method in magnetic resonance imaging that reduces motion artifacts caused by a quasi-periodic physiological movement by synchronizing the MR measurement with the physiological movement of the patient. In this process, the data acquisition takes place in portions known as acquisition phases, which are usually shorter than the period length of the physiological movement and each start in the same phase of the quasi-periodic physiological movement. This requires the use of a sensor to capture the physiological movement. A trigger algorithm analyzes the captured signal and generates a trigger signal as soon as the desired phase is detected within the physiological signal. A break point is inserted in the imaging sequence. When the sequence reaches the break point, the implementation of the sequence is interrupted until the trigger algorithm generates a trigger. Then, the sequence is continued until the next break point. In the embodiment shown in FIG. 5, break points can be inserted before each TR interval. After each trigger signal, each of the N slices is than excited and read out once. The physical TR time, i.e. the time between successive excitations of a particular slice, is then determined no longer by the time $\overline{TR}$ but by the period length of the physiological movement. Since the period length varies, the term "effective repetition time" is used, which equals the average length of a period of the physiological movement when triggering is in each period, or equals a multiple thereof if, for instance, a trigger signal is generated only in every n-th period. $\overline{TR}$ is the measurement duration per cycle, i.e. the duration of an acquisition phase. Examples of quasi-periodic physiological movements are respiration and cardiac movement. In the case of respiratory triggering, it is attempted, for instance, to generate a trigger signal in such a way, i.e. at a time instant, for which a measurement is made only during the relatively still phase at the end of expiration.

Figure 6:
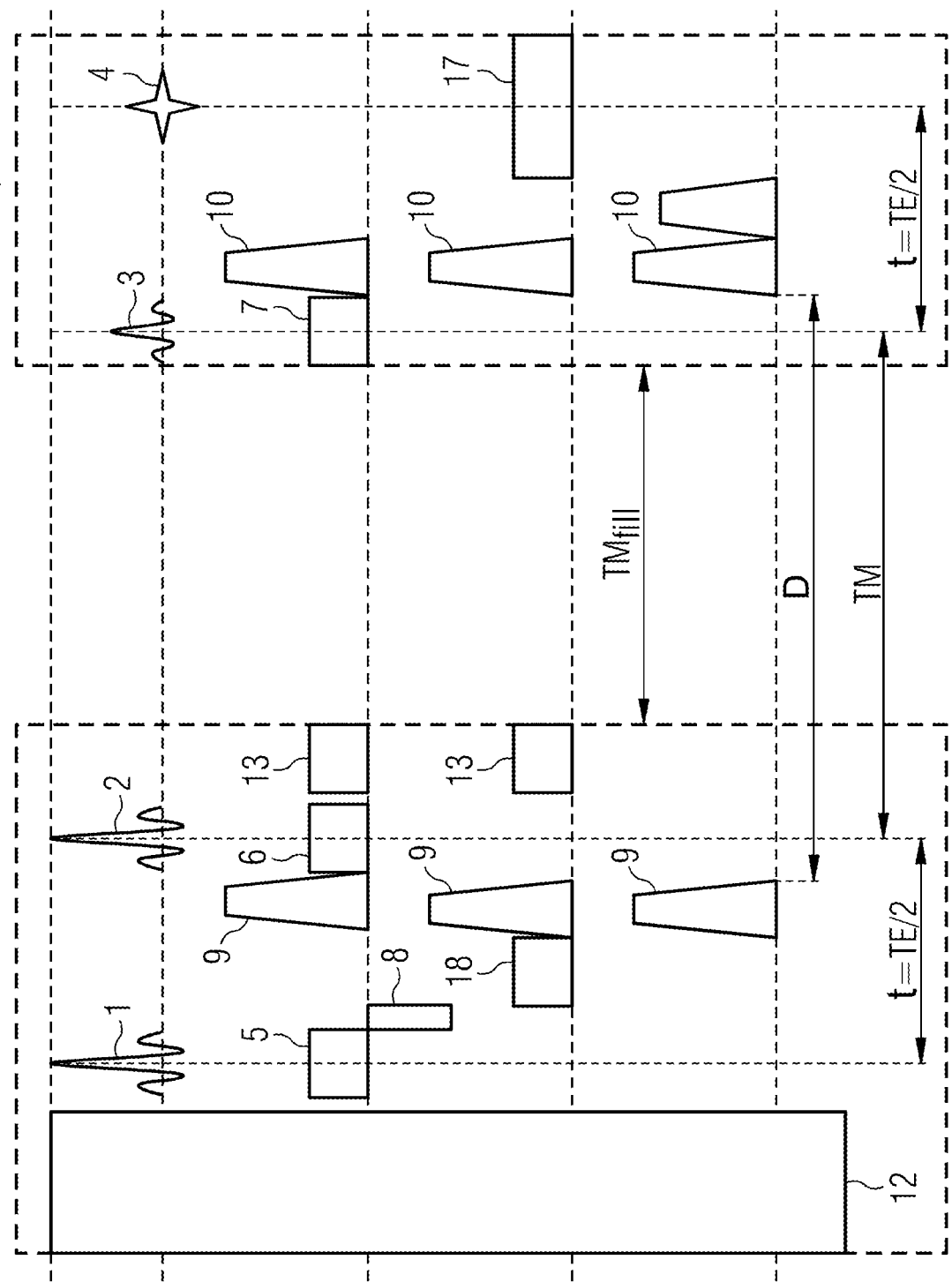
FIG. 6 shows a STEAM sequence having a GRE readout module according to an exemplary embodiment of the disclosure.

FIG. 6 shows a gradient echo STEAM sequence 60, referred to as a GRE sequence for short. In the gradient echo variant, the third RF pulse 3 is replaced by a series of RF pulses of smaller flip angle. As a result of the small flip angle, each of these RF pulses flips only some of the magnetization stored in the longitudinal axis into the transverse plane. This generates a plurality of stimulated echoes 4, which have different TM times and are separately phase-encoded. The right-hand readout module ACQ outlined by dashed lines is therefore repeated l times in FIG. 6, where l is the number of phase-encoding steps that are meant to be read out for each excitation. The totality of the l repetitions forms the readout module ACQ in the context of the disclosure. In the variant shown, a readout pre-phasing gradient 18 is switched in the excitation module EXC, the moment of which is half the size of the moment of a readout gradient 17. A diffusion-weighted gradient echo STEAM sequence is described, for example, in the article "Diffusion imaging Using Stimulated Echoes" by Klaus-Dietmar Merboldt, Wolfgang Hänicke, and Jens Frahm (MAGNETIC RESONANCE IN MEDICINE 19, 233-239 (1991)).

Figure 7:
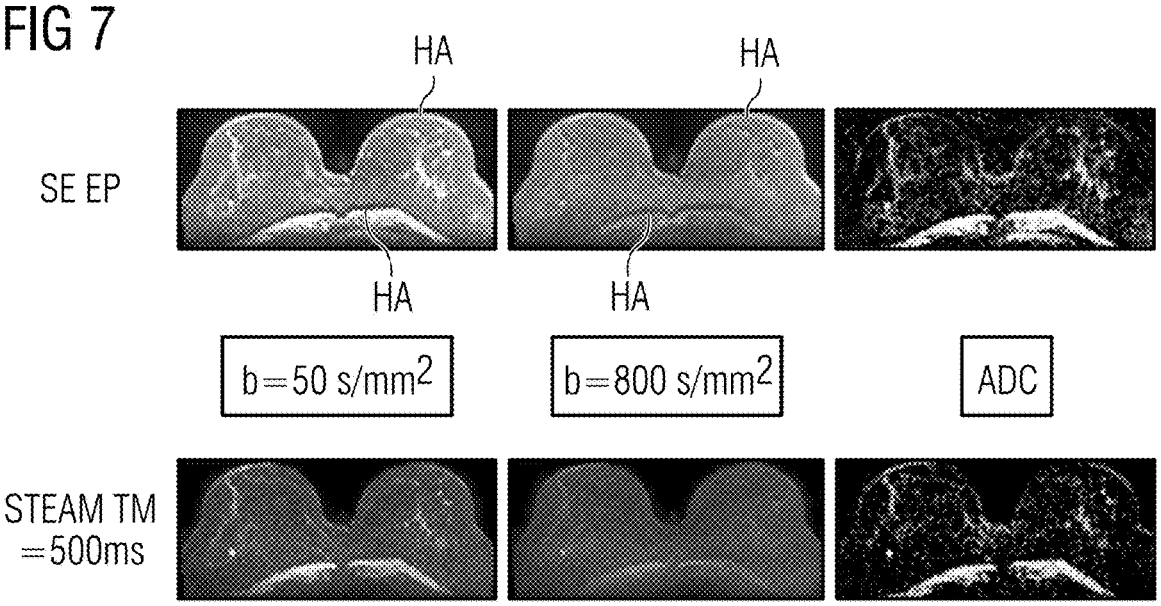
FIG. 7 is a comparative presentation of breast images that were acquired using a diffusion-weighted spin-echo EPI sequence and respectively a diffusion-weighted STEAM EPI sequence according to an exemplary embodiment of the disclosure.

FIG. 7 compares breast images acquired using a diffusion-weighted spin echo EPI sequence, which are shown in the top row, with corresponding images acquired using a diffusion-weighted STEAM EPI sequence with a TM time of 500 ms, which are shown in the bottom row. The aliphatic fat components were suppressed in both image series on the basis of the SPAIR technique by means of a frequency-selective inversion pulse. In the top image row, remaining olefinic fat HA makes it harder to interpret the images. The hypointense regions above the chest muscle is one indicator that the bright signal HA in the top image row relates to olefinic fat. In EPI imaging, an olefinic fat signal is shifted with respect to the water signal in the phase-encoding direction because of the slightly different resonant frequencies. Unlike the adjoining tissue, the muscle does not contain any fat. Thus, the shift produces a hypointense region HA above the muscle. In the images acquired using the STEAM technique, the olefinic fat signal is largely suppressed as well. The hypointense region above the muscle is correspondingly less pronounced.

Figure 8:
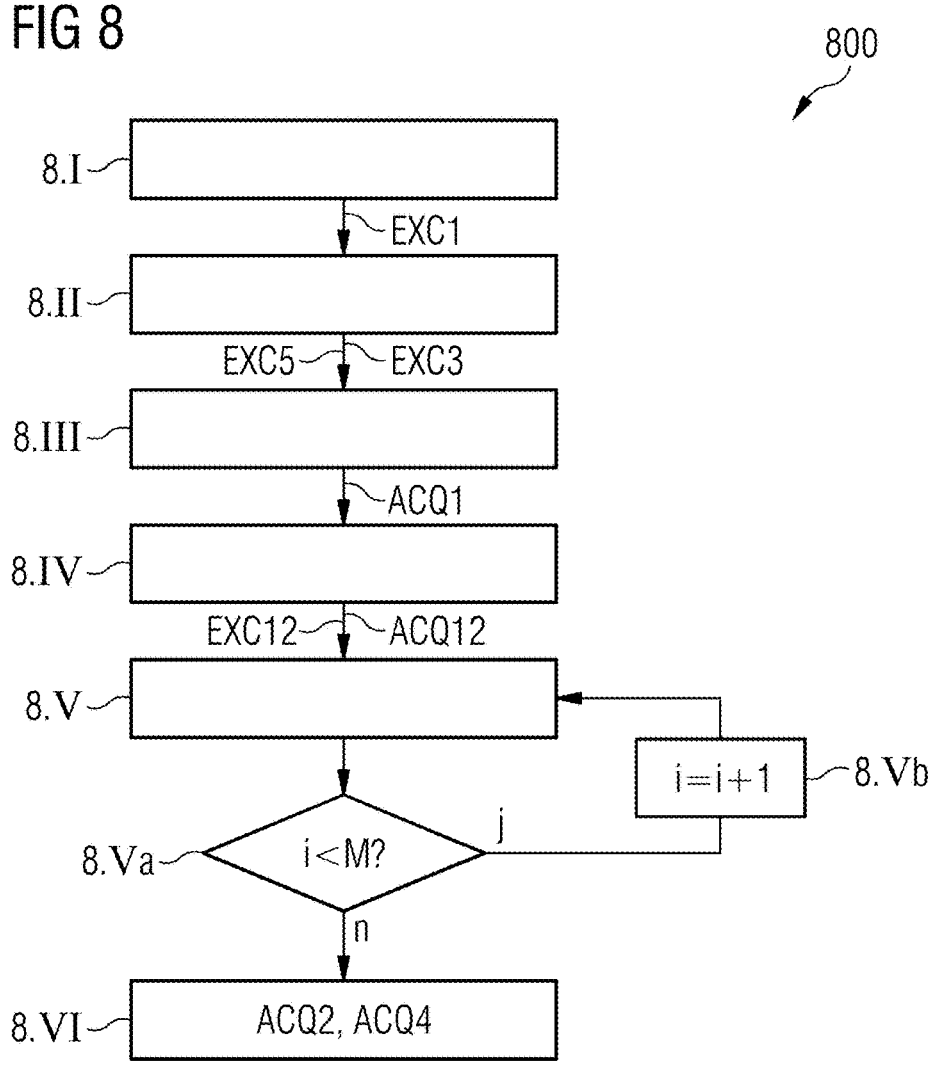
FIG. 8 is a flow diagram 800 illustrating a method for controlling a magnetic resonance imaging system for producing magnetic resonance image data from an object under examination, in which magnetic resonance raw data is captured, according to an exemplary embodiment of the disclosure.

FIG. 8 shows a flow diagram 800 illustrating a method 800 for controlling a magnetic resonance imaging system for producing magnetic resonance image data BD from an object under examination O, in which magnetic resonance raw data RD is captured, according to an exemplary embodiment of the disclosure. In step 8.I, an excitation module $EXC_1$ of a multi-slice STEAM pulse sequence 40 is output for a first slice of a slice stack to be imaged in a region of interest. The excitation module $EXC_1$ comprises a first slice-selective RF excitation pulse 1 and a second slice-selective RF pulse 2 and also suitable gradients, which are used to define a first slice $SL_1$ for readout.

In step 8.II, further excitation modules $EXC_3$, $EXC_5$ for a third slice $SL_3$ and a fifth slice $SL_5$ are output later than the output of the first excitation module $EXC_1$.

Then in step 8.III, a first readout module $ACQ_1$ for the first slice $SL_1$ is output. Magnetic resonance raw data RD is acquired during the readout process. The first readout module $ACQ_1$ comprises a third slice-selective RF pulse 3 and further sequence elements, for instance gradients and readout windows for receiving RF signals 4 from the first slice $SL_1$.

In step 8.IV, excitation modules $EXC_n$ and readout modules $ACQ_n$ for the second to fifth slice $SL_2$, $SL_3$, $SL_4$, $SL_5$ of the slice stack to be imaged are then output alternately in the order $EXC_2$, $ACQ_3$, $EXC_4$, $ACQ_5$. The first repetition interval TR ends after step 4.

In step 8.V, the second, or a further repetition interval TR is then started. This further repetition interval now begins again with the output of the excitation module $EXC_1$ for the first slice $SL_1$. After this are then output alternately a readout module $ACQ_2$ for the second slice $SL_2$ and an excitation module $EXC_3$ for the third slice $SL_3$, and then a readout module $ACQ_4$ for the fourth slice $SL_4$ and an excitation module $EXC_5$ for the fifth slice $SL_5$. After excitation of the fifth slice $SL_5$, the first slice $SL_1$ is then read out by a corresponding readout module $ACQ_1$. Then continues, in alternation, excitation and readout of the second to fifth slice in ascending order by suitable excitation modules $EXC_2$, $EXC_4$ and readout modules $ACQ_3$, $ACQ_5$, as is also illustrated in FIG. 4. This concludes the second repetition interval.

Step 8.V is repeated (M−1) times until every slice of the slice stack to be imaged has been excited M times, and also been read out in full except for a final readout of the second slice $SL_2$ and the fourth slice $SL_4$. This process is represented in FIG. 8 by the steps 8.Va, 8.Vb, in which it is determined whether the counter i for the excitations per slice $SL_n$ has not yet reached the predetermined total number M of excitations per slice $SL_n$. If this is the case, which is represented in FIG. 8 by "y" (=yes), the flow moves to step 8.Vb in which the counter i is incremented, and then step 8.V is repeated. If in step 8.Va the predetermined total number M of excitations per slice is reached, which correspond to the M-th repetition interval, then the flow moves to step 8.VI, which is represented in FIG. 8 by "n" (=no).

Then, in step 8.VI is performed readout of the second slice $SL_2$ and fourth slice $SL_4$, which had still not been read out in the M-th repetition interval in step 8.V. This ends the acquisition process for the magnetic resonance raw data RD.

Figure 9:
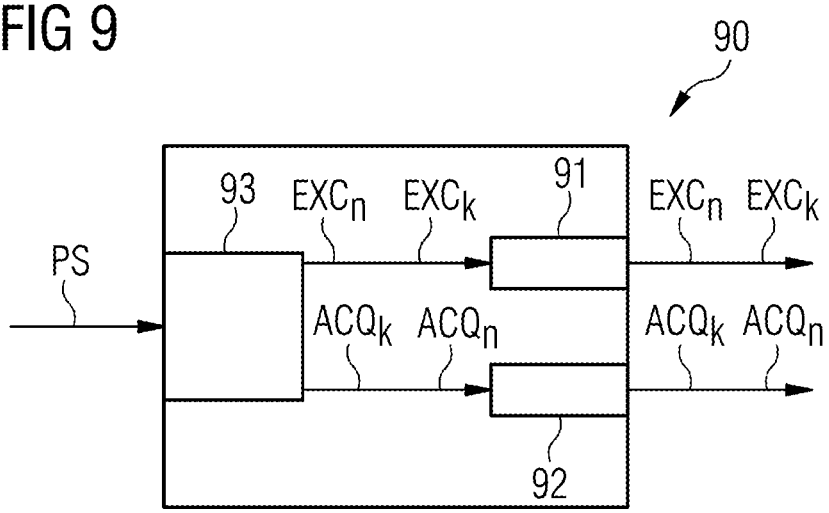
FIG. 9 is a schematic diagram of a control-sequence determination device according to an exemplary embodiment of the disclosure.

FIG. 9 shows a schematic diagram of a control-sequence determination device 90 according to an exemplary embodiment of the disclosure.

Figure 10:
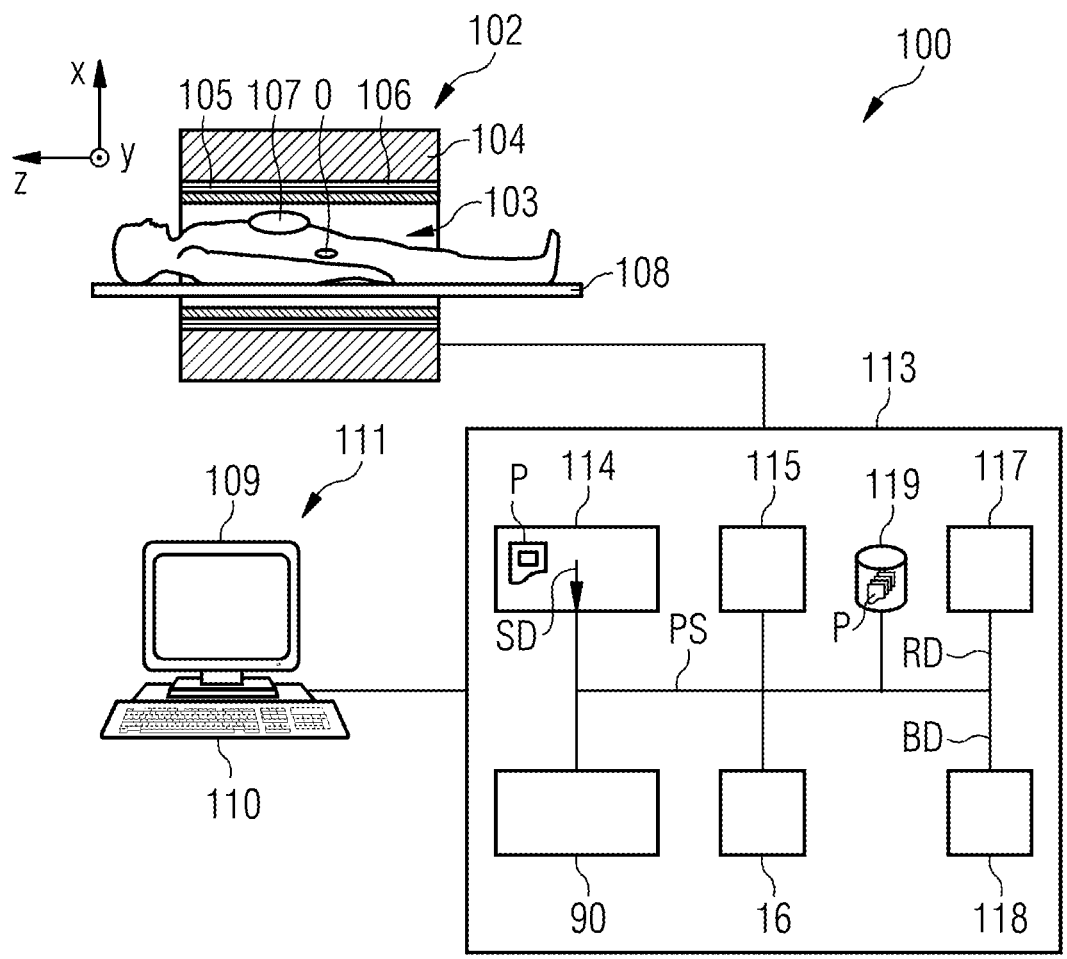
FIG. 10 is a schematic diagram of a magnetic resonance imaging system according to an exemplary embodiment of the disclosure.

The control-sequence determination device 90 is designed to determine a control sequence 40, 50 according to the disclosure, which can be implemented on a magnetic resonance imaging system 100 (see FIG. 10). The control-sequence determination device 90 comprises an excitation-module generating unit (e.g. circuitry) 91 for generating an excitation module $EXC_n$ for each slice $SL_n$ of a slice stack, wherein a first slice-selective RF excitation pulse and a second slice-selective RF pulse are generated for each slice. Part of the control-sequence determination device 90 is also a readout-module generating unit (e.g. circuitry) 92, which is configured to generate one readout module $ACQ_n$ for each slice $SL_n$ for acquiring magnetic resonance raw data RD, wherein the readout module $ACQ_n$ comprises a third slice-selective RF pulse and further sequence elements, for instance gradients and readout windows for spatial encoding and for receiving RF signals.

In addition, the control-sequence determination device 90 comprises an arranging unit (e.g. circuitry) 93, which is configured to control the excitation-module generating unit 91 and the readout-module generating unit 92 in accordance with a pulse sequence scheme PS according to the disclosure, so that between the excitation module $EXC_n$ of one slice $SL_n$ and the associated readout module $ACQ_n$, further excitation modules $EXC_k$ and/or readout modules $ACQ_l$ for other slices $SL_k$, $SL_l$ are output.

FIG. 10 shows a sketch of a magnetic resonance system 100 according to the disclosure (referred to below as "MR system" for short). The magnetic resonance system 100 comprises the actual magnetic resonance scanner 102 containing an examination space 103 or patient tunnel, into which can be moved on a couch 108 a patient O, or rather in this case a patient or person under examination, in whose body is located, for instance, a specific organ to be imaged.

The magnetic resonance scanner 102 is equipped in the usual manner with a main magnetic field system 104, a gradient system 106, and also an RF transmit antenna system 105 and an RF receive antenna system 107. In the exemplary embodiment shown, the RF transmit antenna system 105 is a body coil that is fixed in the magnetic resonance scanner 102, whereas the RF receive antenna system 107 consists of local coils (represented in FIG. 10 by a single local coil) to be arranged on the patient or person under examination. In principle, however, the whole-body coil 105 can also be used as the RF receive antenna system, and the local coils 107 can be used as the RF transmit antenna system, provided these coils can each be switched into different operating modes.

The MR system 100 also comprises a central control device 113, which is used to control the MR system 100. This central control device 113 comprises a sequence control unit 114 for controlling the pulse sequence. This is used to control the timing of radiofrequency pulses (RF pulses) and gradient pulses according to a selected imaging sequence PS. Such an imaging sequence can be specified, for example, in a measurement or control protocol P. Different control protocols P for different measurements are typically stored in a memory 119, and can be selected by an operator (and possibly modified if required), and then used to perform the measurement. The sequence control unit 114 also comprises a control-sequence determination device 90 according to the disclosure that has the design shown in FIG. 9. The control-sequence determination device generates control data SD, which facilitates the series of excitation modules and readout modules shown in FIG. 9 that are output by the sequence control unit 114 for controlling the pulse sequence.

For the output of the individual RF pulses, the central control device 113 comprises a radiofrequency transmit device 115, which generates and amplifies the RF pulses and feeds said RF pulses into the RF transmit antenna system 105 via a suitable interface (not shown in detail). The control device 113 comprises a gradient system interface 116 for controlling the gradient coils of the gradient system 106. The sequence control unit 114 communicates in a suitable manner, e.g. by sending out sequence control data SD, with the radiofrequency transmit device 115 and the gradient system interface 116 for the emission of the pulse sequences PS in the order produced by the control-sequence determination device. The control device 113 also comprises a radiofrequency receive device 117 (likewise communicating with the sequence control unit 114 in a suitable manner) for the purpose of coordinated acquisition of magnetic resonance signals received by the RF transmit antenna system 107. A reconstruction unit 118 receives the acquired data after demodulation and digitization as raw data RD and reconstructs the MR image data therefrom. This image data BD can then be stored in a memory 119, for example.

The central control device 113 can be operated by means of a terminal having an input unit 110 (such as a user interface) and a display unit 109, via which an operator can hence also operate the entire MR system 100. MR images can also be displayed on the display unit 109, and the input unit 110, if applicable in combination with the display unit 109, can be used to plan and start measurements, and in particular to select and, if applicable, modify suitable control protocols containing suitable measurement sequences, as described above.

Furthermore, the MR system 100 according to the disclosure and e.g. the control device 113 can also comprise a multiplicity of further components, which are not shown here in detail but are typically present in such equipment, for instance components such as a network interface, to connect the entire system to a network and to be able to transfer raw data RD and/or image data BD or parameter maps, but also other data such as patient-related data or control protocols, for example.

The principles of how suitable raw data RD can be acquired by applying RF pulses and generating gradient fields, and how MR images BD can be reconstructed from said raw data, are known to a person skilled in the art and are not explained further here. Likewise, a variety of measurement sequences such as e.g. EPI sequences, GRE measurement sequences, or TSE measurement sequences (TSE=turbo spin echo) for generating dynamic or static images are known in principle to a person skilled in the art.

FIG. 11 shows a schematic diagram 120 of sub-sequences having alternating excitation modules EXC and readout modules ACQ for different slices.

The equation already used in the general section $\widetilde{TM} = TM(A-1) \times T_{Block}$ shall be explained briefly with reference to FIG. 11 for the case A=3.

In the method according to the disclosure, between the sub-sequence S-SQ1 containing the excitation module EXC1 for the first slice and the sub-sequence S-SQ3 containing the readout module ACQ1 for the first slice are implemented A−2 further sub-sequences, so in this case one further sub-sequence S-SQ2. The duration of a sub-sequence is $T_{Block}$. This in turn means that the time difference between the RF pulse of a readout module ACQ2 of one sub-sequence S-SQ1 and the RF pulse of the readout module ACQ4 of the subsequent sub-sequence S-SQ2 is also equal to $T_{Block}$, because the timing of the excitation module and the readout module within a sub-sequence is the same for all the sub-sequences.

The time difference $\widetilde{TM}$ between the second RF pulse of the excitation module EXC1 and the RF pulse of the readout module ACQ2 of a sub-sequence S-SQ1 therefore differs from the physical mixing time TM by precisely A−1 time intervals, so in the example by precisely two time intervals, $T_{Block}$.

Finally, it shall be reiterated that the methods and devices described above are merely preferred exemplary embodiments, and that the disclosure can be modified by a person skilled in the art without departing from the scope of the disclosure insofar and/or as defined by the claims. So, although the method according to the disclosure has been described using the example of a diffusion-weighted single-shot EPI sequence, the disclosure is in no way restricted to diffusion-weighted sequences or single-shot sequences or EPI sequences, and any suitable type of sequences may be used It is mentioned for the sake of completeness that the use of the indefinite article "a" or "an" does not rule out the possibility of there also being more than one of the features concerned. Likewise, the term "unit" does not exclude the possibility that said unit consists of a plurality of components, which may also be spatially distributed if applicable.

What is claimed is:

1. A method for controlling a magnetic resonance imaging system for generating magnetic resonance image data from an object under examination in which magnetic resonance raw data is captured, the method comprising:
   generating at least one multi-slice stimulated echo acquisition mode (STEAM) pulse sequence including:
   an excitation module for each slice of a plurality of slices, each excitation module comprising a first slice-selective RF excitation pulse and a second slice-selective RF pulse;
   a readout module for each slice of the plurality of slices for acquiring the magnetic resonance raw data, the readout module comprising a third slice-selective RF pulse and sequence elements for spatially encoding and receiving radio frequency (RF) signals, and
   wherein at least one excitation module or readout module for another respective slice is implemented between the excitation module and the readout module of a respective slice of the plurality of slices;
   capturing the magnetic resonance raw data based upon the generated at least one multi-slice STEAM pulse sequence; and
   generating the magnetic resonance image data based upon the captured magnetic resonance raw data; and
   presenting magnetic resonance images on a display based upon the generated magnetic resonance data.

2. A control-sequence determination device configured to determine a control sequence implemented on a magnetic resonance imaging system, the control-sequence determination device comprising:
   excitation-module generating circuitry configured to generate an excitation module for each slice of a plurality of slices, each excitation module comprising a first slice-selective RF excitation pulse and a second slice-selective RF pulse,
   readout-module generating circuitry configured to generate a readout module for each slice of the plurality of slices for acquiring magnetic resonance raw data, the readout module comprising a third slice-selective RF pulse and sequence elements for spatially encoding and receiving radio frequency (RF) signals,
   arranging circuitry configured to control the excitation-module generating circuitry and the readout-module generating circuitry such that at least one excitation module or readout module for another respective slice is implemented between the excitation module and the readout module of a respective slice from among the plurality of slices; and
   processing circuitry configured to capture the magnetic resonance raw data based upon the determined control sequence, to generate magnetic resonance image data based upon the captured magnetic resonance raw data, and to cause magnetic resonance images to he presented on a display based upon the generated magnetic resonance image data.

3. A non-transitory computer-readable medium having instructions stored thereon that, when executed by a processing circuitry of a magnetic resonance imaging system, cause the magnetic resonance imaging system to generate magnetic resonance image data from an object under examination in which magnetic resonance raw data is captured by:
generating at least one multi-slice stimulated echo acquisition mode (STEAM) pulse sequence including:
an excitation module for each slice of a plurality of slices, each excitation module comprising a first slice-selective RF excitation pulse and a second slice-selective RF pulse;
a readout module for each slice of the plurality of slices for acquiring the magnetic resonance raw data, the readout module comprising a third slice-selective RF pulse and sequence elements for spatially encoding and receiving radio frequency (RF) signals, and
wherein at least one excitation module or readout module for another respective slice is implemented between the excitation module and the readout module of a respective slice from among the plurality of slices;
capturing the magnetic resonance raw data based upon the generated at least one multi-slice STEAM pulse sequence;
generating the magnetic resonance image data based upon the captured magnetic resonance raw data; and
causing magnetic resonance images to be presented on a display based upon the generated magnetic resonance image data.

4. The method as claimed in claim 1, wherein for each repetition interval identified with the pulse sequence, sub-sequences of a constant sub-sequence duration are implemented successively in time, with at least one of the sub-sequences comprising one excitation module.

5. The method as claimed in claim 1, wherein for each repetition interval identified with the pulse sequence, sub-sequences of a constant sub-sequence duration are implemented successively in time, with at least one of the sub-sequences comprising one output module.

6. The method as claimed in claim 1, wherein for each repetition interval identified with the pulse sequence, sub-sequences of a constant sub-sequence duration are implemented successively in time, with at least one of the sub-sequences comprising an excitation module and a readout module that are each assigned to different respective slices from among the plurality of slices.

7. The method as claimed in claim 1, wherein:
the readout module corresponds to a sub-sequence of the same slice as the excitation module of a sub-sequence that was output a number (A−1) steps previously, and
A represents an integer greater than one.

8. The method as claimed in claim 1, wherein:
a number N of excitation modules and a number (N−A+1) of readout modules are implemented in an initial repetition interval TR,
A−1 readout modules are implemented in a final interval, a condition $$T_{Block} = \frac{TR}{N}$$

is satisfied, with $T_{Block}$ denoting a duration of a sub-sequence,
A represents an integer greater than one.

9. The method as claimed in claim 1, wherein:
a number of N excitation modules and a number (N−A+1) of readout modules are implemented in each one of a number of repetition intervals TR identified with the pulse sequence for each one of a number N of the plurality of slices,
a condition $$T_{Block} = \frac{TR}{N + A - 1}$$

is satisfied, with $T_{Block}$ denoting a duration of a sub-sequence, and
A represents an integer greater than one.

10. The method as claimed in claim 8, further comprising:
acquiring N different ones of the plurality of slices a number of M times,
wherein a number of successively-implemented sub-sequences has a value of M×N+A−1, and
wherein M defines a number of readout modules per slice.

11. The method as claimed in claim 9, wherein a number of successively implemented sub-sequences has a value of M×(N+A−1), and
wherein M defines a number of readout modules per slice.

12. The method as claimed in claim 1, wherein:
a number of N slices of the plurality of slices are excited repeatedly in succession,
a first excitation module of at least a second slice of the number of N slices is implemented earlier than a second excitation module for a first slice of the number of N slices, and
a first readout module for the second slice is implemented later than a second excitation module for the first slice.

13. The method as claimed in claim 1, wherein the excitation module and the readout module of at least one sub-sequence comprise diffusion gradients that differ in terms of direction or amplitude.

14. The method as claimed in claim 1, wherein the first and the second slice-selective RF excitation pulses each influence a plurality of different slices simultaneously.

15. The method as claimed in claim 1, wherein for each repetition interval identified with the pulse sequence, sub-sequences of a constant sub-sequence duration are implemented successively in time, with one of the sub-sequences comprising only one excitation module.

16. The method as claimed in claim 1, wherein for each repetition interval identified with the pulse sequence, sub-sequences of a constant sub-sequence duration are implemented successively in time, with one of the sub-sequences comprising only one output module.

17. The method as claimed in claim 1, wherein:
for each repetition interval identified with the pulse sequence, sub-sequences of a constant sub-sequence duration are implemented successively in time,
one sub-sequence from among the sub-sequences comprises an excitation module of a first slice and a readout module of a second slice, and
the first slice is different from the second slice.

18. The method as claimed in claim 1, wherein for each repetition interval identified with the pulse sequence, sub-sequences of a constant sub-sequence duration are implemented successively in time, and wherein the sub-sequences comprise an excitation module and/or a readout module assigned to different respective slices from among the plurality of slices such that the STEAM pulse sequence comprises an interleaving of pulse sequences identified with different ones of the plurality of slices.

\* \* \* \* \*